United States Patent [19]

Menigaux

[11] Patent Number: 4,742,013
[45] Date of Patent: May 3, 1988

[54] PROCESS FOR THE PRODUCTION OF A SEMICONDUCTOR LASER WITH TAPE GEOMETRY AND LASER OBTAINED BY THIS PROCESS

[76] Inventor: Louis Menigaux, 85 Avenue des Tilleuls 91440, Bures Sur Yvette, France

[21] Appl. No.: 863,154

[22] Filed: May 14, 1986

[30] Foreign Application Priority Data

May 21, 1985 [FR] France ................................ 85 07619

[51] Int. Cl.[4] .................. H01L 21/265; H01L 21/208
[52] U.S. Cl. ......................................... 437/19; 372/45; 372/46; 437/22; 437/129; 148/DIG. 94
[58] Field of Search ............... 148/1.5, 175; 29/569 L, 29/576 B; 372/45, 46; 437/19

[56] References Cited

U.S. PATENT DOCUMENTS

| | | | |
|---|---|---|---|
| 3,936,322 | 2/1976 | Blum et al. | 148/1.5 |
| 4,535,220 | 8/1985 | Cullis et al. | 219/121 LM |
| 4,536,940 | 8/1985 | Henry et al. | 29/569 L |
| 4,539,743 | 9/1985 | Anthony et al. | 29/576 B |
| 4,564,403 | 1/1986 | Hayafuji et al. | 148/171 |
| 4,639,275 | 1/1987 | Holonyak, Jr. et al. | 148/1.5 |
| 4,655,850 | 4/1987 | Kakimoto et al. | 148/1.5 |

FOREIGN PATENT DOCUMENTS

| | | |
|---|---|---|
| 0025749 | 3/1981 | European Pat. Off. . |
| 2030766 | 4/1980 | United Kingdom . |
| 2077484 | 12/1981 | United Kingdom . |

OTHER PUBLICATIONS

Nuclear Instruments & Methods, vol. 182/183, Apr.-May 1981, pp. 699-703, North-Holland Publishing Company, Amsterdam; Y. Yuba et al.: "Deep levels in implanted, pulse-laser-annealed GaAs".

IEEE Journal of Quantum Electronics, vol. QE-16, No. 8, Aug. 1980, pp. 898-901, IEEE, New York, U.S.; A. J. Schorr et al.; "Development of self-pulsations due to self-annealing of proton bombarded regions during aging in proton bombarded stripe".

IEEE Jornal of Quantum Electronics, vol. QE-11, No. 7, Jul. 1975; pp. 413-418, New York, U.S.; J. M. Blum et al.; "Oxygen-implanted double-heterojunction GaAs/GaAlas injection lasers".

Primary Examiner—Upendra Roy
Attorney, Agent, or Firm—Oblon, Fisher, Spivak, McClelland & Maier

[57] ABSTRACT

Process is disclosed for the production of a semiconductor laser with tape geometry and laser obtained by this process.

After producing a double heterostructure on a substrate, a p-dopant is implanted in these layers, so that the two layers are made insulating. This is followed by local annealing by focussing an appropriate energy source. The electrical conduction properties of the annealed part are restored and it is doped. Thus, a p-doped conductive tape is produced between two electrically insulating parts above the active zone of the laser, which increases the current confinement in said zone.

The disclosed invention is used in optical telecommunications.

2 Claims, 1 Drawing Sheet

PROCESS FOR THE PRODUCTION OF A SEMICONDUCTOR LASER WITH TAPE GEOMETRY AND LASER OBTAINED BY THIS PROCESS

BACKGROUND OF THE INVENTION

The present invention relates to a process for the production of a semiconductor laser with a tape or ribbon geometry, as well as to a laser obtained by this process. It is used in optical telecommunications.

The technical field of the invention is that of semiconductor lasers having a so-called double heterostructure. Such a structure is constituted by a stack of semiconductor layers deposited by epitaxy on a monocrystalline substrate. In general, starting from the substrate, there is a first confinement layer, an active layer (which is responsible for the light emission), a second confinement layer, a contact layer and finally a metal layer. The double heterostructure character results from the fact that the active layer is surrounded by two layers, whose composition differs from that of the active layer.

For lasers emitting between 0.8 and 0.9 μm, the confinement layers are of alloy $Ga_{1-x}Al_xAs$ and the active layer and substrate are of GaAs. For lasers emitting between 1.3 and 1.65 μm, the confinement layers are of $Ga_{1-x}In_xAs_{1-y}P_y$, whilst the active layer and substrate are of InP.

The threshold current density is approximately 1 kA/cm$^2$ for such structures. In order to reduce the threshold current, use is made of different methods making it possible to define an active, narrow tape. The latter makes it possible to confine the charge carriers and direct them towards the active zone.

Three methods are essentially known for forming said tape;

1. The implantation of protons on either side of a window, which makes it possible to produce two highly resistive regions. The current only passes into the non-implanted window. This method is e.g. described in the article by L. A. D'Asaro, published in "Journal of Luminescence", 7,310, 1973 and in the article by H. Kan, H. Namizaki, M. Ishii and A. Ito published in Appl. Phys. Lett., 27,138, 1975.

2. The diffusion of zinc up to the active zone through a silica window, whereby the diffused zone has a higher conduction than the bordering regions. This method is e.g. described in the article by H. Yonezu, I. Sakuma, K. Kobayashi, T. Kamejima, M. Ueno and Y. Nannichi, published in Jpn. J. Appl. Phys. 12, 1585, 1973 and in the article by H. Yonezu, Y. Matsumoto, T. Shinohara, I. Sakuma, T. Suzudi, K. Kobayashi, R. Lang, Y. Nannichi and I. Hayashi, published in Jpn. N. Appl. Phys., 16 209, 1977.

3. By producing a buried tape, in the manner described in the article of T. Tsukada published in "Jour. Appl. Phys.", 45, 4899, 1974.

Although satisfactory in certain respects, these three methods suffer from the following disadvantages:

The first, which has recourse to a lateral implantation of protons, does not improve the conduction in the carrier injection zone.

The second, which involves central diffusion, does not reduce the conduction in the lateral zones.

Finally, the third, uses very complex technology with in particular a repeat of the epitaxy.

SUMMARY OF THE INVENTION

The object of the present invention is to obviate these disadvantages. It therefore recommends a process combining the implantation and diffusion methods. According to the invention, the entire surface of the laser structure is implanted with a type p doping impurity (e.g. beryllium) to a desired depth. Thus, the surface layer becomes electrically insulating due to the total or almost total amorphization induced by the high dose of impurities introduced "by force" into the semiconductor. This is followed by the local annealing of the implanted zone by focusing an appropriate energy source, which restores a crystalline structure to the material appropriate for a good electrical conduction. By displacement of the radiation source or the plate supporting the semiconductor structure, the annealed zone is given the shape of a tape with the desired dimensions.

Thus, the advantages of implantation (leading to insulation in the lateral zones) and diffusion (leading to an improvement in the conduction in the zone defining the tape) are combined.

The invention also relates to a laser obtained by this process and which is characterized by the presence of a p-doped crystalline tape surrounded by amorphous lateral zones.

BRIEF DESCRIPTION OF THE DRAWINGS

The invention is described in greater detail hereinafter relative to a nono-limitative embodiment and the attached drawings, wherein show.

DETAILED DESCRIPTION OF THE PREFERRED EMBODIMENT

Figure 1:
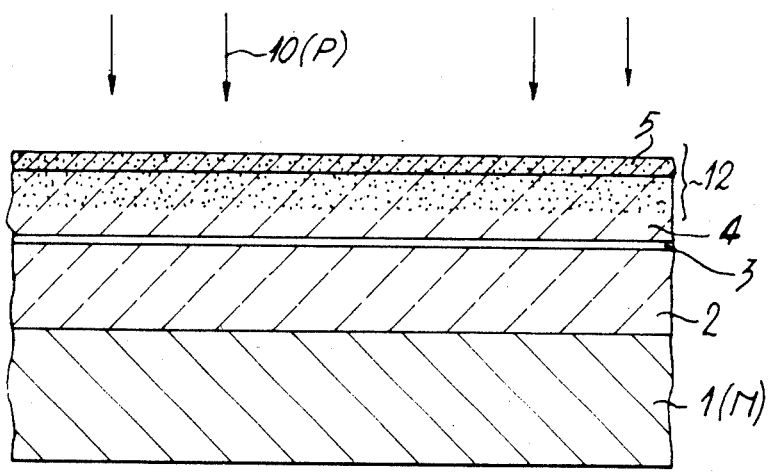
FIG. 1, in section, a double heterostructure following the first implantation operation.

FIG. 1 shows a double heterostructure comprising a type n substrate 1, a first confinement layer 2, an active layer 3, a second confinement layer 4 and a contact layer 5.

According to the invention, ion implantation, diagrammatically indicated by arrows 10, is performed with the aid of a type p dopant, which has the effect of making a zone 12 (indicated by dotted lines) amorphous. Thus, this zone has a high electrical resistivity. For this implantation, use can e.g. be made of beryllium, implanted with an energy between 250 and 350 keV with a dose between $5.10^{14}$ and $5.10^{15}$ cm$^2$. Implantation must be such that the active zone 3 is approached, but not reached.

Figure 2:
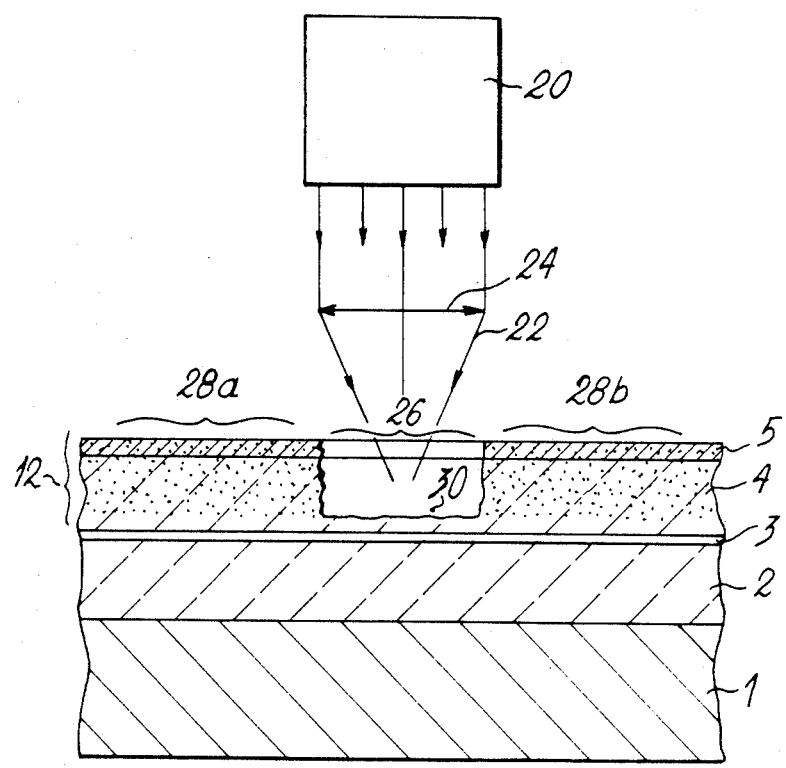
FIG. 2, in the same section, the structure following annealing.

The second stage of the inventive process is illustrated in FIG. 2. By means of a source 20, such as an electron gun or laser, the double heterostructure obtained after implantation is irradiated by a high energy beam appropriately focussed by a means 24 for heating the surface layers 4, 5 over a small surface 26.

Heating produces a recrystallization of material in a volume represented by zone 30 located beneath surface 26. The depth of this volume is dependent on the energy supplied, which is regulated in such a way that the recrystallization reaches the bottom of the implanted zone.

The said recrystallization restores the conductivity to the material and this is also increased through the presence of the previously implanted p dopant. By rectilinearly displacing either source 20, or the double heterostructure, a tape is formed, along which the conductivity is excellent. The tape is bordered by two amorphous zones 28a, 28b, where the resistivity is high. Thus, a doubly effective confinement of the carriers is obtained.

The use of a laser as source 20 would appear to be particularly advantageous. It is possible to use a pulsed laser of the YAG,Nd$^{3+}$ type supplying a mean energy density of approximately 0.1 Joule/cm$^2$. The displacement speed of the impact point can be 0.01 cm/s. It is also possible to use a mask with a rectilinear opening and illuminate the entity by a lamp.

When the implantation and recrystallization operations have been completed, a metal layer (not shown in the drawings) is deposited on the entity and is connected to a power supply.

In the case of a GaAs/GaAlAs heterostructure, it is possible to have the following compositions and thicknesses for the different layers, without the invention being limited thereto:

Layer 1: GaAs, thickness 100 μm,
Layer 2: n-doped $Ga_{0.7}Al_{0.3}As$ ($10^{18}$ cm$^{-3}$), thickness 1 μm,
Layer 3: undoped GaAs, thickness 0.5 μm,
Layer 4: p-doped $Ga_{0.7}Al_{0.3}As$ ($10^{18}$ cm$^{-3}$), thickness 1 μm,
Layer 5: p$^+$-doped $Ga_{0.9}Al_{0.1}As$ ($5.10^{18}$ cm$^{-3}$), thickness 0.2 μm.

What is claimed is:

1. A process for the production of a semiconductor laser, comprising the steps of:
    forming a double heterostructure on a substrate, said double heterostructure comprising a first confinement layer, an active layer, a second confinement layer and a contact layer,
    implanting in the contact layer and in part of the second confinement layer a p-type doping impurity with an energy and dose such that the implanted zone is made amorphous,
    irradiating the implanted structure with a focussed high energy beam able to recrystallize the amorphous zone along a tape.

2. A process according to claim 1, wherein said high energy beam is a focussed optical radiation, the double heterostructure and radiation being displaced rectilinearly with respect to one another to obtain a tape.

* * * * *